United States Patent
Shimada et al.

(10) Patent No.: US 6,396,095 B1
(45) Date of Patent: May 28, 2002

(54) SEMICONDUCTOR MEMORY AND METHOD OF DRIVING SEMICONDUCTOR MEMORY

(75) Inventors: Yasuhiro Shimada, Kyoto; Koji Arita, Osaka, both of (JP); Kiyoshi Uchiyama, Colorado Springs, CO (US)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/869,522

(22) PCT Filed: Oct. 27, 2000

(86) PCT No.: PCT/JP00/07533
§ 371 (c)(1),
(2), (4) Date: Jun. 29, 2001

(87) PCT Pub. No.: WO01/33633
PCT Pub. Date: May 10, 2001

(30) Foreign Application Priority Data

Oct. 29, 1999 (JP) ............................................. 11-309329

(51) Int. Cl.⁷ ...................... H01L 29/76; H01L 29/94; H01L 31/062; H01L 31/113; H01L 31/119
(52) U.S. Cl. ...................... 257/295; 257/296; 257/310; 257/314; 257/315
(58) Field of Search ................ 257/295–313, 257/314–326

(56) References Cited

U.S. PATENT DOCUMENTS

| 4,612,560 A | * | 9/1986 | Dortu et al. .................. 357/22 |
| 5,654,568 A | | 8/1997 | Nakao |
| 5,737,261 A | * | 4/1998 | Taira .......................... 365/145 |
| 6,146,904 A | * | 11/2000 | Hsu et al. ....................... 438/3 |
| 6,303,502 B1 | * | 10/2001 | Hsu et al. ..................... 438/680 |
| 6,323,528 B1 | * | 11/2001 | Yamazaki et al. ........... 257/411 |

FOREIGN PATENT DOCUMENTS

| JP | 6-224384 | 8/1994 |
| JP | 6-275846 | 9/1994 |

OTHER PUBLICATIONS

International Search Report dated Jan. 30, 2001.

\* cited by examiner

Primary Examiner—Eddie Lee
Assistant Examiner—Jesse A. Fenty
(74) Attorney, Agent, or Firm—Eric J. Robinson; Nixon Peabody LLP

(57) ABSTRACT

Source/drain regions for a field effect transistor are defined in a semiconductor substrate with a channel region interposed therebetween. A first gate electrode is formed over the semiconductor substrate with an insulating film sandwiched therebetween and has a gate length shorter than the length of the channel region. A ferroelectric film is formed to cover the first gate electrode and to have both side portions thereof make contact with the insulating film. A second gate electrode is formed to cover the ferroelectric film.

3 Claims, 4 Drawing Sheets

(a)

(b)

SEMICONDUCTOR MEMORY AND METHOD OF DRIVING SEMICONDUCTOR MEMORY

TECHNICAL FIELD

The present invention relates to a nonvolatile semiconductor memory device implemented as a field effect transistor including a ferroelectric film at its gate, and a method of driving the device.

BACKGROUND ART

A known field effect transistor with a ferroelectric film at its gate (which will be herein referred to as a "ferroelectric FET") will be described with reference to FIG. 4.

As shown in FIG. 4, the ferroelectric FET includes: insulating film 4 as a contact layer; ferroelectric film 3; and gate electrode 15 that have been formed in this order on a silicon substrate 8 in which source/drain regions 5 and 6 have been defined. A channel region 7 is defined in part of the silicon substrate 8 between the source/drain regions 5 and 6. In this structure, if up or down polarization is created in the ferroelectric film 3 and the threshold voltage of the ferroelectric FET can be set to one of two different values corresponding to these two polarization states, the up or down polarization existing in the ferroelectric film 3 is retained so long as the polarization state of the ferroelectric film 3 is retainable. Thus, data is stored in the ferroelectric FET.

As shown in FIG. 5, a memory cell is formed at each intersection of a matrix array by connecting word line W, bit line B, and source line S to the gate electrode 15, drain region 6 and source region 5 of the ferroelectric FET, respectively.

FIG. 6 shows a planar layout for a memory cell array where the memory cells are arranged in matrix. In FIG. 6, M11, M12, M21 and M22 denote ferroelectric FETs as memory cells C11, C12, C21 and C22, each of which is located at an intersection of the memory cell array. W1 denotes a word line connected to the gates of the ferroelectric FETs M11 and M12. W2 denotes a word line connected to the gates of the ferroelectric FETs M21 and M22. S1 denotes a source line connected to the sources of the ferroelectric FETs M11 and M12. S2 denotes a source line connected to the sources of the ferroelectric FETs M21 and M22. B1 denotes a bit line connected to the drains of the ferroelectric FETs M11 and M21. And B2 denotes a bit line connected to the drains of the ferroelectric FETs M12 and M22.

The logical state of a selected memory cell is determined depending on whether the ferroelectric FET of the memory cell is ON or OFF. The ON or OFF state of a ferroelectric FET is determined depending on whether or not the channel region 7 of the ferroelectric FET is electrically continuous. A gate voltage, turning the ferroelectric FET ON in one of the two polarization states exhibited by the ferroelectric film 3 upon the application of the gate voltage to the gate electrode 15 of the ferroelectric FET or OFF in the other polarization state, exists between the two mutually different threshold voltages. Thus, when such a gate voltage is applied to the gate electrode 15, the logical state of the ferroelectric FET in ON state is supposed to be "1" and that of the FET in OFF state "0", respectively.

To know the logical state retained on the memory cell C11 shown in FIG. 6, for example, on this condition, the bit line B1 is discharged to have a low potential, and then the voltage on the source line S1 is raised to a read voltage. Thereafter, the voltage on the word line W1 is set to a value between the two threshold voltages. In this case, if the ferroelectric film 3 of the ferroelectric FET M11 has the low threshold voltage, i.e., the logical state of the ferroelectric FET M11 is "1", the ferroelectric FET M11 is ON state and a current flows from the source line S1 toward the bit line B1. Thus, the bit line B1 is charged and the voltage on the bit line B1 rises. On the other hand, if the ferroelectric film 3 of the ferroelectric FET M11 has the high threshold voltage, i.e., the logical state of the ferroelectric FET M11 is "0", then the ferroelectric FET M11 is OFF state. Thus, the bit line B1 is not charged and the voltage on the bit line B1 remains low. Accordingly, it is possible to know the logical state retained on the memory cell depending on whether the voltage on the bit line B1 is high or low.

However, if a voltage is applied to the word line every time data is read out, the ferroelectric film of a ferroelectric FET in "0" state will be supplied with voltages gradually approaching "1" state even where the voltage is an intermediate value between the two threshold voltages that determine the polarization states of the ferroelectric film. As a result, the "0"-state ferroelectric film, connected to the word line through which the read voltage is applied, gradually makes a transition to "1" state every time a read operation is performed. Thus, there is a problem that a disturb phenomenon occurs, i.e., it becomes more and more difficult to tell "0" from "1".

To avoid this problem, the ferroelectric FET is made to operate either in enhancement mode or depletion mode in accordance with the polarization state of the ferroelectric film, and the enhancement and depletion modes are associated with the two logical levels. Then, it is possible to read data with no voltage applied onto the word line.

However, the depletion mode ferroelectric FET is always "1", i.e., normally ON, even when the gate voltage is zero. Accordingly if the logical state retained on a non-selected memory cell is "1", a path for a current flowing from a bit line to a source line is formed by way of the non-selected memory cell. As a result, there occurs a problem that a voltage on the bit line is variable depending on the state of the non-selected memory cell.

For that reason, as disclosed in Japanese Laid-Open Publication No. 8-139286, select transistors need to be disposed between a selected memory cell and a word line and between the memory cell and a bit line, respectively. Accordingly, there occurs another problem that the number of devices making up a memory cell increases.

That is to say, if such ferroelectric FETs are arranged in matrix, the select transistors are needed between each memory cell and an associated word line and between the cell and an associated bit line. Further, a substrate for a ferroelectric FET in each memory cell should be electrically isolated at least from a substrate for a ferroelectric FET in another memory cell which is connected to an adjacent word or bit line, with a well region interposed between them. Otherwise, a selective write operation cannot be performed. As a result, the size of the memory cell unintentionally increases, typically several times as large as a memory cell with one transistor and one capacitor.

DISCLOSURE OF INVENTION

It is therefore an object of the present invention to solve the above-mentioned problems, i.e., to eliminate the disturb phenomenon when data is read out and to reduce the area of a memory cell by having the memory cell constructed of a smaller number of devices.

To achieve this object, a semiconductor memory device according to the present invention includes: source/drain regions for a field effect transistor, the source/drain regions being defined in a semiconductor substrate with a channel region interposed therebetween; an insulating film formed on the semiconductor substrate; a first gate electrode which is formed on the insulating film and has a gate length shorter than the length of the channel region; a ferroelectric film formed to cover the first gate electrode and to have both side portions thereof make contact with the insulating film; and a second gate electrode formed to cover the ferroelectric film.

In the semiconductor memory device according to the present invention, when data is read out, the polarization in the ferroelectric film, which determines continuous or discontinuous state of the channel region, is not affected even if a positive voltage is applied to the first gate electrode with the semiconductor substrate and second gate electrode grounded. Thus, during the read operation, the polarization does not decrease even upon the application of the voltage to the gate electrode, i.e., no disturb phenomenon occurs.

Further, since the first gate electrode acts as a gate for selectively connecting the drain region to a bit line, no select transistor is needed for the bit line. Thus, the area of the memory cell can be reduced.

Accordingly, no disturb phenomenon occurs when data is read out and the memory cell, and eventually an array of the memory cells, can have their areas reduced because the memory cell can be constructed of a smaller number of devices.

In the semiconductor memory device according to the present invention, the first gate electrode is preferably connected to a word line, the second gate electrode is preferably connected to a first control line, which is parallel to the word line, by way of a select transistor, and the select transistor preferably includes a gate electrode connected to a second control line parallel to a bit line.

Then, the ON/OFF states of the select transistor are controllable using the second control line to selectively connect or disconnect the second gate electrode to/from the first control line. Thus, in a situation where a memory cell array is made up of the semiconductor memory devices arranged in matrix, data can be read out from, or written on, a memory cell, which is selected from a plurality of memory cells and represents a desired bit, by using the first and second control lines.

An inventive driving method is supposed to be applied to driving a semiconductor memory device including: source/drain regions for a field effect transistor, the source/drain regions being defined in a semiconductor substrate with a channel region interposed therebetween; an insulating film formed on the semiconductor substrate; a first gate electrode which is formed on the insulating film and has a gate length shorter than the length of the channel region; a ferroelectric film formed to cover the first gate electrode and to have both side portions thereof make contact with the insulating film; and a second gate electrode formed to cover the ferroelectric film. In this method, a voltage is applied between the first gate electrode and the semiconductor substrate to read out data, while a voltage is applied between the second gate electrode and the semiconductor substrate to write or erase data.

In the inventive method for driving the semiconductor memory device, in reading data it is determined whether a current flows between the drain/source regions when a voltage is applied between the first gate electrode and the semiconductor substrate. Then, the polarization state in the ferroelectric film is known, and the data stored can be read out. In this case, the polarization state in the ferroelectric film is not affected even if a positive voltage is applied to the first gate electrode. Thus, during the read operation, the polarization does not decrease even upon the application of the voltage to the gate electrode, i.e., no disturb phenomenon occurs.

Further, when a voltage is applied between the second gate electrode and semiconductor substrate so that a voltage supplied to the ferroelectric film changes the direction of the polarization in the ferroelectric film, data can be written or erased.

BEST MODE FOR CARRYING OUT THE INVENTION

Figure 1:
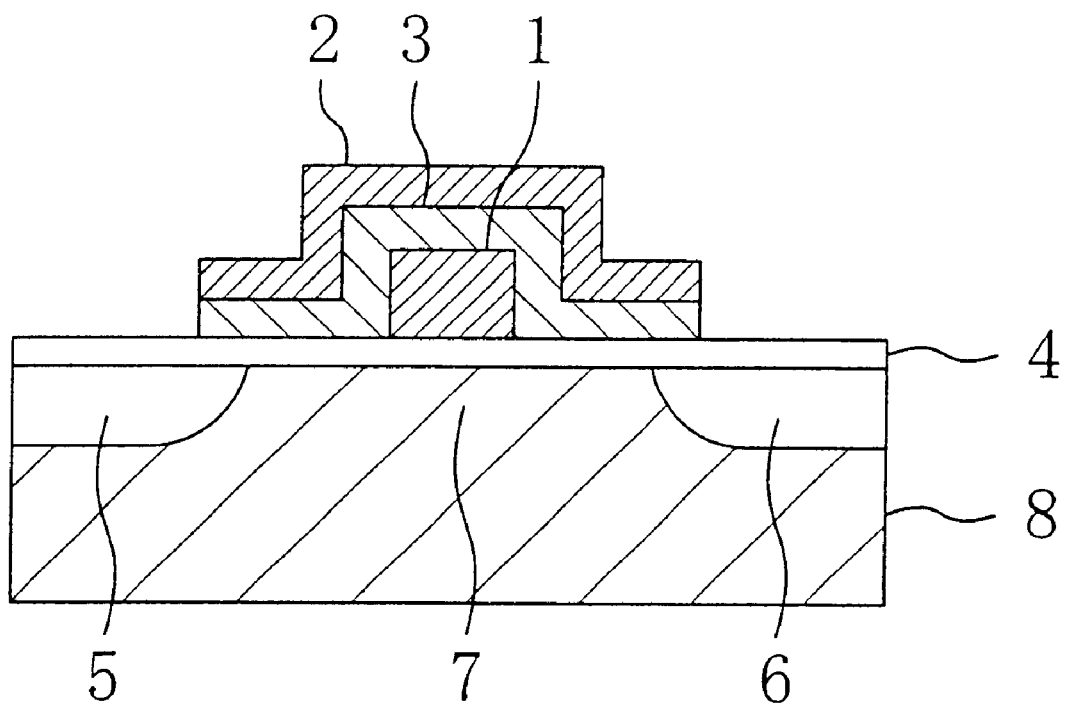
FIG. 1 is a cross-sectional view illustrating a semiconductor memory device according to an embodiment of the present invention.
Figure 2:
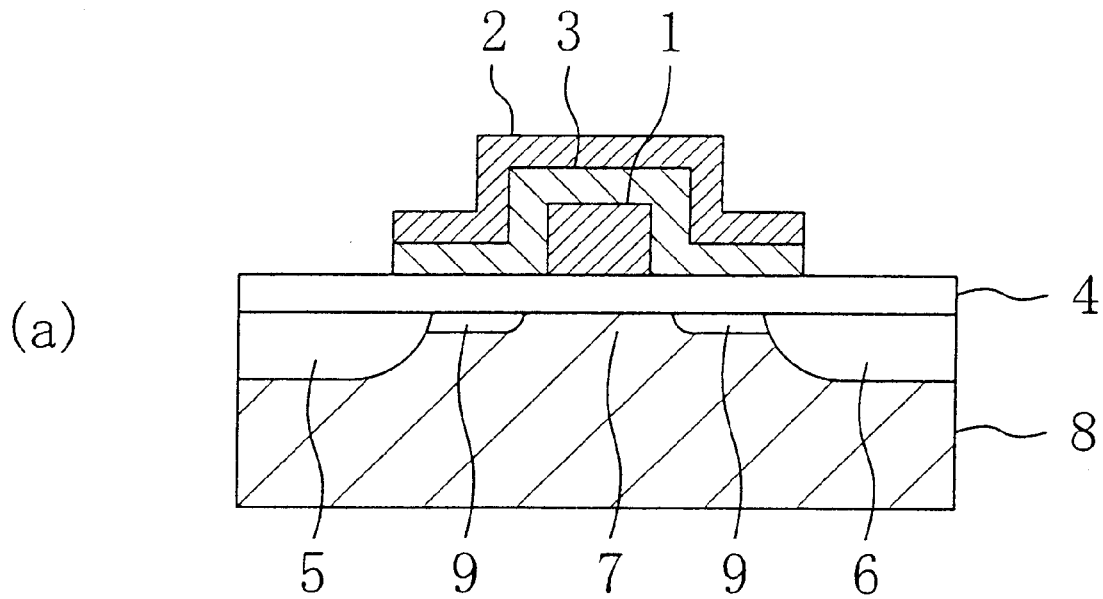
FIGS. 2(*a*) and 2(*b*) are cross-sectional views illustrating how a semiconductor memory device according to an embodiment of the present invention operates.
Figure 2:
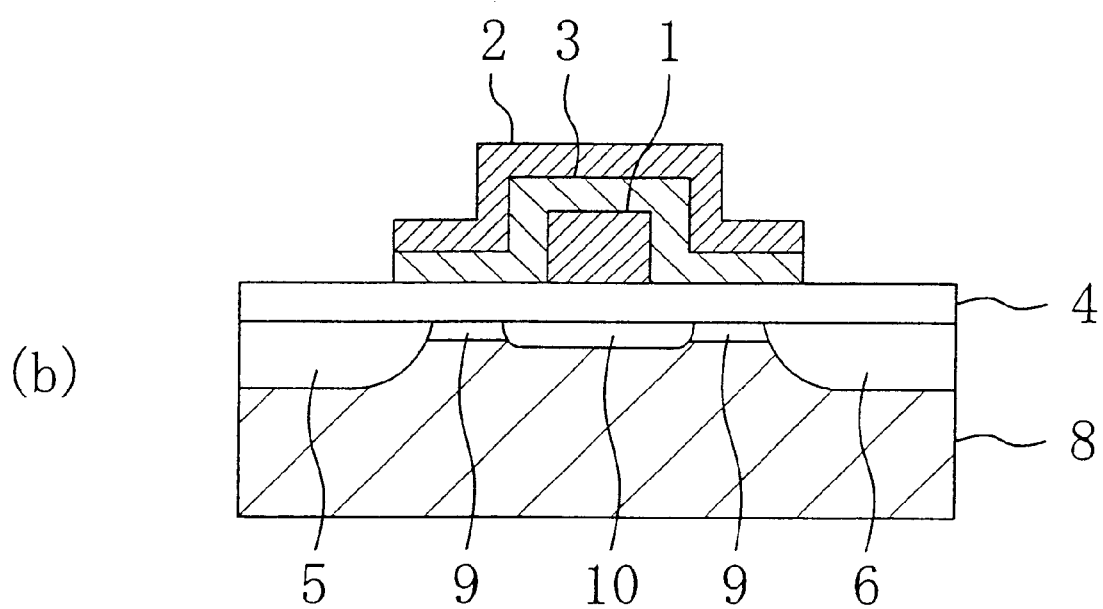

Hereinafter, a structure for a semiconductor memory device according to an embodiment of the present invention will be described with reference to FIGS. 1 and 2. FIG. 1 is a cross-sectional view illustrating a semiconductor memory device according to an embodiment of the present invention. FIGS. 2(*a*) and 2(*b*) are cross-sectional views illustrating how a semiconductor memory device according to an embodiment of the present invention operates.

As shown in FIG. 1, a ferroelectric FET is made up of: insulating film 4 formed on a silicon substrate 8 in which source/drain regions 5 and 6 have been defined; first gate electrode 1 formed on the insulating film 4; ferroelectric film 3 formed on the first gate electrode 1 to cover the first gate electrode 1; and second gate electrode 2 formed to cover the ferroelectric film 3. In this case, the first gate electrode 1 and both side portions of the ferroelectric film 3 are in contact with the insulating film 4, and parts of these portions in the ferroelectric film 3, which are in contact with the insulating film 4, are located above the source/drain regions 5 and 6. A part of the silicon substrate 8 between the source/drain regions 5 and 6 will be a channel region 7. In the ferroelectric FET according to this embodiment, the silicon substrate 8 is a p-type silicon substrate, and the source/drain regions 5 and 6 are doped with an n-type dopant.

Hereinafter, the operations of the ferroelectric FET according to this embodiment will be described.

First, when a gate voltage, which is positive with respect to the silicon substrate 8, is applied to the second gate electrode 2, a potential difference, created between the second gate electrode 2 and silicon substrate 8, is distributed between the ferroelectric film 3 and insulating film 4 in the regions where the ferroelectric film 3 is in contact with the insulating film 4 (i.e., parts of in the channel region 7 other than the region under the first gate electrode 1). In this case, if the voltage is applied to the second gate electrode 2 so that the potential difference distributed to the ferroelectric film 3 is larger than a voltage at which the polarization of the ferroelectric film 3 reverses its direction, the polarization of the ferroelectric film 3 in its portions in contact with the insulating film 4 becomes downward.

Hereinafter, the operation in this situation will be described with reference to FIG. 2(a).

In the regions where the ferroelectric film 3 is in contact with the insulating film 4, the down polarization in the ferroelectric film 3 produces a first depletion layer 9 that is negatively charged in parts of the channel region 7 other than its part under the first gate electrode 1, thereby reducing the potential at the interfaces between the silicon substrate 8 and those parts of the channel region 7 other than that part under the first gate electrode 1. That is to say, continuous channel regions are formed in those parts of the channel region 7 other than that part under the first gate electrode 1. Since the ferroelectric film 3 also exists above the source/drain regions 5 and 6, the first depletion layer 9 forms the continuous channel regions extending from the source/drain regions 5 and 6, respectively. However, the first depletion layer 9 discontinues the region under the first gate electrode 1, thus the continuous channel regions also discontinue at the region under the first gate electrode 1. Accordingly, though the channel region 7 is partially continuous, the ferroelectric FET is not continuous as a whole.

On the other hand, when a gate voltage, which is negative with respect to the silicon substrate 8, is applied to the second gate electrode 2 so that the potential difference distributed to the ferroelectric film 3 is larger than the voltage at which the polarization of the ferroelectric film 3 reverses its direction, the polarization of the ferroelectric film 3 in its portions in contact with the insulating film 4 becomes upward. Though the up polarization in the ferroelectric film 3 creates positive charges at the interfaces between the ferroelectric film 3 and silicon substrate 8, no depletion layer is formed in the silicon substrate 8 because the positive charges are stored around the interfaces. As a result, no continuous channel regions are formed partially in the channel region 7 because the potential at the interfaces between the ferroelectric film 3 and silicon substrate 8 is equal to that in the silicon substrate 8.

As described above, in those parts of the channel region 7 other than the region under the first gate electrode 1, the first depletion layer 9 may or may not be formed depending on whether the polarization in the ferroelectric film 3 is up or down. And the ferroelectric FET is always discontinuous electrically whether the polarization of the ferroelectric film 3 is up or down. This state is retained so long as there is remnant polarization in the ferroelectric film 3, so the ferroelectric FET can store data thereon.

Then, to read out the data stored, it may be examined whether a current flows between the drain/source regions 6 and 5 when a potential difference is produced between the drain/source regions 6 and 5 and a positive voltage is applied to the first gate electrode 1.

Hereinafter, the operation in this situation will be described with reference to FIG. 2(b).

If the polarization in the ferroelectric film 3 is downward, a second depletion layer 10 is produced in part of the channel region 7 under the first gate electrode 1 upon the application of a voltage to the first gate electrode 1. Thus, the first depletion layer 9, which has been produced by the down polarization of the ferroelectric film 3, and the second depletion layer 10, which has been produced upon the application of the voltage to the first gate electrode 1, are connected to each other. As a result, the source/drain regions 5 and 6 become electrically continuous by way of the continuous channel region so that the ferroelectric FET turns ON and a current flows between the source/drain regions.

On the other hand, if the polarization in the ferroelectric film 3 is upward, the first depletion layer 9 is not formed. Thus, the channel region is not electrically continuous even if the second depletion layer 10 is formed in the part of the channel region 7 under the first gate electrode 1 upon the application of the voltage to the first gate electrode 1. As a result, the ferroelectric FET remains OFF, and no current flows between the source/drain regions.

In a read operation of data, when a positive voltage is applied to the first gate electrode 1 with the silicon substrate 8 and second gate electrode 2 grounded, potential differences are produced between the first gate electrode 1 and silicon substrate 8 and between the first and second gate electrodes 1 and 2, respectively. However, since those potential differences act mainly on the first gate electrode 1 vertically, the polarization in the ferroelectric film 3, which produces the first depletion layer 9, is not affected. That is to say, during the read operation, the polarization does not decrease even upon the application of the voltage to the gate electrode, i.e., no disturb phenomenon occurs.

Figure 3:
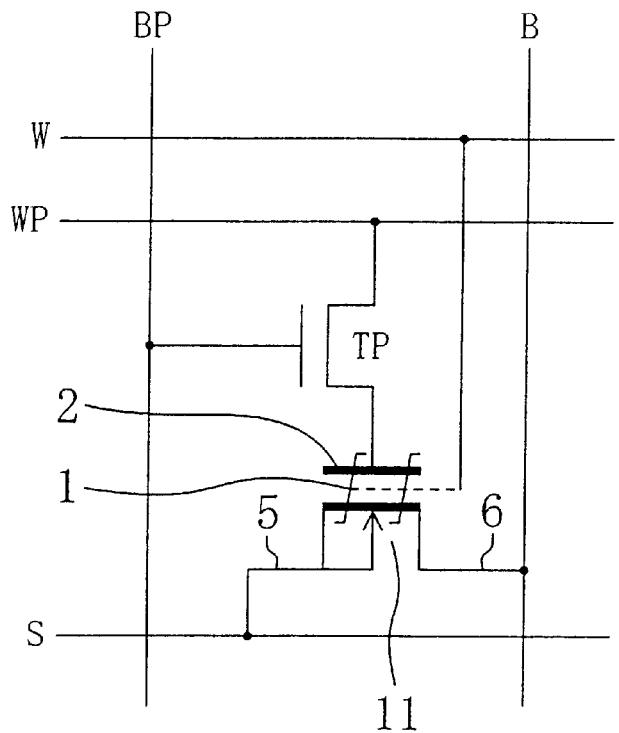
FIG. 3 is a circuit diagram of a memory cell having the structure of a semiconductor memory device according to an embodiment of the present invention.
Figure 4:
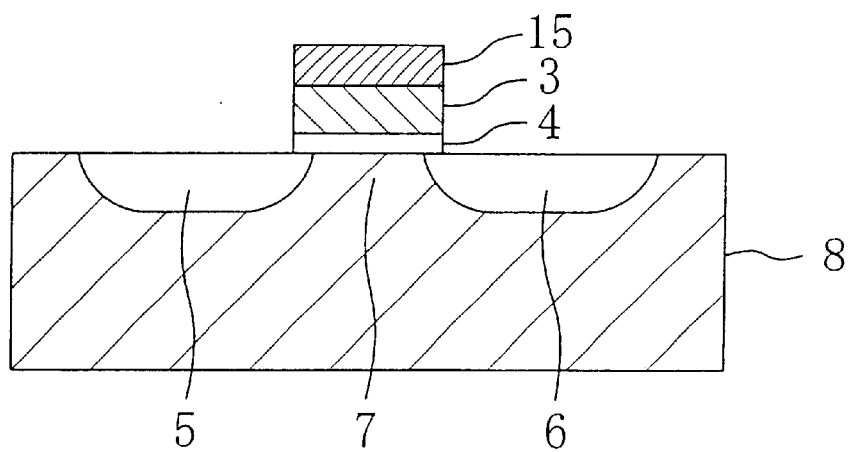
FIG. 4 is a cross-sectional view illustrating a known semiconductor memory device.
Figure 5:
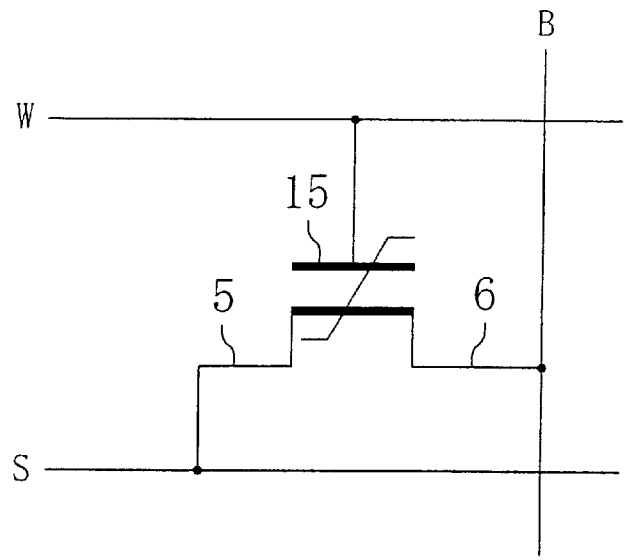
FIG. 5 is a circuit diagram of a memory cell having the structure of the known semiconductor memory device.
Figure 6:
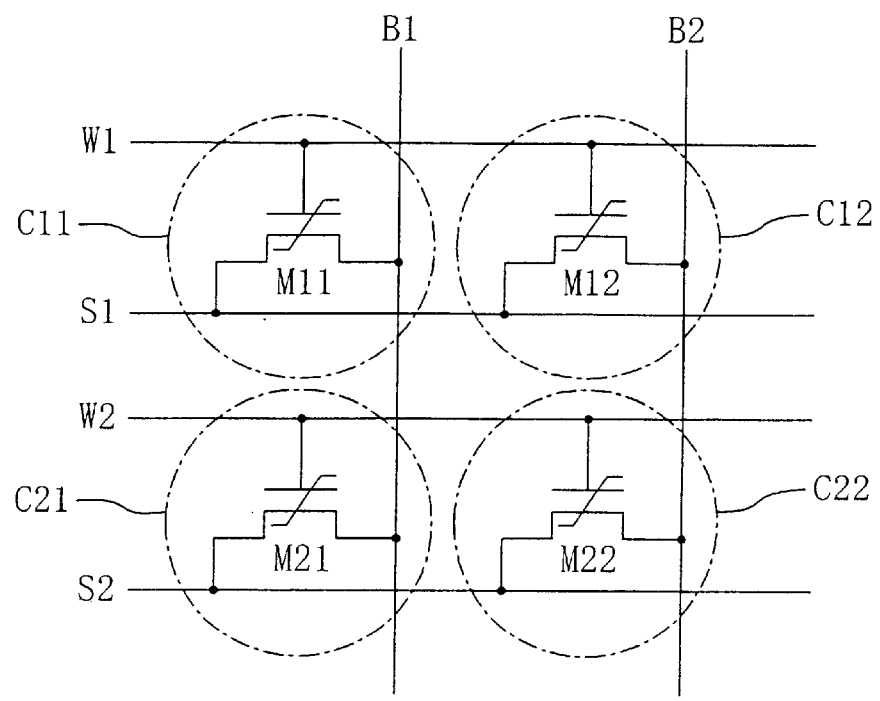
FIG. 6 is a circuit diagram of a memory cell array implemented using the known semiconductor memory devices.

Next, a method for driving the semiconductor memory device according to this embodiment will be described with reference to FIG. 3. FIG. 3 is a circuit diagram of a memory cell having the structure of the semiconductor memory device according to this embodiment.

As shown in FIG. 3, in the ferroelectric FET, the first gate electrode 1 is connected to a word line W; the second gate electrode 2 is connected to a first control line WP parallel to the word line W by way of a select transistor TP; the gate of the select transistor TP is connected to a second control line BP parallel to a bit line B; source/drain regions 5 and 6 are connected to source and bit lines S and B, respectively; and a well region 11 is connected to the source line S.

Hereinafter, a driving method for reading data from the memory cell will be described.

First, the potential level on every line connected to the memory cell is set to a low level, e.g., a ground level, the potential level on the word line W is set high and then the potential level on the source line S is set high. Then, no current flows into the bit line B when the polarization in the ferroelectric film 3 is upward. On the other hand, a current flows into the bit line B when the polarization in the ferroelectric film 3 is downward, thereby increasing the potential level on the bit line B.

In a situation where a large number of memory cells performing a read operation in this manner are arranged in matrix, if potential levels on respective word lines W for non-selected ones of the memory cells connected to a common bit line B, are set to a low level, the ferroelectric FETs in the non-selected memory cells are in OFF state irrespective of their polarization states. Thus, the polarization state of only the selected memory cell can be sensed as the potential level on the bit line B. That is to say, the first gate electrode 1 acts as a gate for selectively connecting the FET to the bit line B. In addition, even when the potential level on each of the word lines W is set to a high level during the read operation, no disturb phenomenon occurs because of the reason described above.

Hereinafter, a driving method for erasing data from the memory cell will be described.

Erasure of data, or a state in which the ferroelectric FET is OFF even when a voltage is applied to the first gate electrode 1, is achieved by making the polarization in the ferroelectric film 3 upward.

First, the potential level on the first control line WP is set to a low level, e.g., a ground potential, and the potential level on the second control line BP connected to the selected memory cell is set to a high level, thereby turning the select transistor TP ON and equalizing the potential level at the second gate electrode 2 with that at the first control line WP.

Next, with the potential level on the word line W kept low, each of the potential levels on the bit and source lines S and B and well region 11 is set to a high level to create the up polarization in the ferroelectric film 3. If a well region 11 is disposed for a number of memory cells in common along a bit line, the data stored in the memory cells that shares the well region 11 can be erased at once.

Hereinafter, a driving method for writing data on a memory cell will be described.

To write data on a memory cell, i.e., to turn a ferroelectric FET ON when a voltage is applied to the first gate electrode 1, the ferroelectric film 3 of only the memory cell on which data will be written should have up polarization.

Accordingly, by setting the potential level on the second control line BP connected to the selected memory cell to a high level, the select transistor TP is turned ON and the potential level at the second gate electrodes 2 is equalized with the level on the first control line WP. In addition, the potential level at the well region 11 is set to a low level, e.g., a ground potential, and a positive voltage, which is larger than a voltage at which the polarization in the ferroelectric film 3 reverses its direction, is applied to the first control line WP. Then, data can be written on the desired memory cell.

As described above, in the semiconductor memory device according to this embodiment, a logical state can be stored digitally depending on whether the polarization in the ferroelectric film is up or down. The stored logical state can be read out so long as there is remnant polarization in the ferroelectric film. Further, a desired memory cell can be selected and data can be erased and written from/on it.

INDUSTRIAL APPLICABILITY

In a semiconductor memory device according to the present invention and a method for driving the device, no disturb phenomenon occurs when data is read out and, a memory cell, and eventually an array of the memory cells, can have their areas reduced because the memory cells can be constructed of a smaller number of devices.

What is claimed is:

1. A semiconductor memory device characterized by comprising:

source/drain regions for a field effect transistor, the source/drain regions being defined in a semiconductor substrate with a channel region interposed therebetween;

an insulating film formed on the semiconductor substrate;

a first gate electrode which is formed on the insulating film and has a gate length shorter than the length of the channel region;

a ferroelectric film formed to cover the first gate electrode and to have both side portions thereof make contact with the insulating film; and a second gate electrode formed to cover the ferroelectric film.

2. The semiconductor memory device of claim 1 characterized in that the first gate electrode is connected to a word line, and that the second gate electrode is connected to a first control line, which is parallel to the word line, by way of a select transistor, and that the select transistor includes a gate electrode connected to a second control line parallel to a bit line.

3. A method for driving a semiconductor memory device, the device comprising: source/drain regions for a field effect transistor, the source/drain regions being defined in a semiconductor substrate with a channel region interposed therebetween; an insulating film formed on the semiconductor substrate; a first gate electrode which is formed on the insulating film and has a gate length shorter than the length of the channel region; a ferroelectric film formed to cover the first gate electrode and to have both side portions thereof make contact with the insulating film; and a second gate electrode formed to cover the ferroelectric film, the method characterized by: applying a voltage between the first gate electrode and the semiconductor substrate to read out data; and applying a voltage between the second gate electrode and the semiconductor substrate to write or erase data.

* * * * *